(12) United States Patent
Imanishi

(10) Patent No.: US 11,476,183 B2
(45) Date of Patent: Oct. 18, 2022

(54) SEMICONDUCTOR PACKAGE

(71) Applicant: Mitsubishi Electric Corporation, Tokyo (JP)

(72) Inventor: Motoki Imanishi, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 17/095,805

(22) Filed: Nov. 12, 2020

(65) Prior Publication Data
US 2021/0351114 A1   Nov. 11, 2021

(30) Foreign Application Priority Data
May 11, 2020  (JP) .............................. JP2020-083335

(51) Int. Cl.
*H01L 23/495* (2006.01)
*H01L 23/00* (2006.01)
*H01L 23/31* (2006.01)

(52) U.S. Cl.
CPC .... *H01L 23/49575* (2013.01); *H01L 23/3107* (2013.01); *H01L 23/4952* (2013.01); *H01L 23/49503* (2013.01); *H01L 23/49562* (2013.01); *H01L 24/45* (2013.01); *H01L 2224/48137* (2013.01); *H01L 2224/48245* (2013.01); *H01L 2224/48699* (2013.01); *H01L 2924/1033* (2013.01); *H01L 2924/10272* (2013.01); *H01L 2924/13055* (2013.01); *H01L 2924/1426* (2013.01)

(58) Field of Classification Search
CPC ........... H01L 23/49575; H01L 23/3107; H01L 23/4952; H01L 23/49562; H01L 24/45; H01L 224/48137
See application file for complete search history.

(56) References Cited

U.S. PATENT DOCUMENTS

| | | | |
|---|---|---|---|
| 2003/0107120 A1* | 6/2003 | Connah | H02M 7/53871 257/691 |
| 2017/0154877 A1* | 6/2017 | Tanimoto | H01L 25/07 |
| 2019/0006258 A1* | 1/2019 | Muto | H01L 21/481 |
| 2019/0109064 A1* | 4/2019 | Kao | H01L 23/3731 |
| 2019/0385942 A1* | 12/2019 | Saegusa | H01L 23/49575 |

FOREIGN PATENT DOCUMENTS

JP           2008-198907 A       8/2008

* cited by examiner

*Primary Examiner* — Marc Anthony Armand
(74) *Attorney, Agent, or Firm* — Studebaker & Brackett PC

(57) ABSTRACT

A semiconductor package includes: a semiconductor device; a lead frame; a built-in package including an insulated driver having a multi-chip configuration and driving the semiconductor device; a wire connecting the built-in package to the semiconductor device; and a resin sealing the semiconductor device, the lead frame, the built-in package, and the wire, wherein the built-in package is directly joined to the lead frame.

13 Claims, 9 Drawing Sheets

FIRST MAIN SURFACE SIDE

SECOND MAIN SURFACE SIDE

SEMICONDUCTOR PACKAGE

BACKGROUND OF THE INVENTION

Field

The present disclosure relates to a semiconductor package.

Background

For a transfer-molded power module, package in package (PIP) is used in which another built-in package is sealed in a transfer-molded package. In related art, a built-in package is installed in a substrate while being supported by a spacer or the like, and the whole package is sealed by a resin (for example, see paragraph 0062 and FIG. 2 of JP 2008-198907 A).

SUMMARY

In a transfer-molded power module, a power device operating at a high voltage is mounted on a lead frame. When the spacer and the power device are adjacent to each other, insulation performance lowers due to an insufficient creepage distance. Further, there has been a problem that the power module may be used under a severe condition such as a high temperature condition, the package is subjected to a stress, the spacer is thus damaged, and reliability lowers.

Further, a high-voltage-side driving unit of a transfer-molded power module in related art is configured as one chip in which an HVIC level shifter is built. However, the HVIC level shifter has limitations on a communication speed, malfunction prevention, and so forth. Accordingly, it is necessary to use an insulated driver in which a signal isolator is installed. The insulated driver insulates an input side and an output side from each other and thus has a multi-chip configuration in which plural chips are sealed in one package. In order to mount this multi-chip configuration on an existing lead frame, development of a new lead frame is necessary, and there have been problems with cost and mountability.

The present disclosure has been made for solving an above-described problem, and one object thereof is to obtain a semiconductor package that may prevent lowering of insulation performance and reliability and may improve cost saving and mountability.

A semiconductor package according to the present disclosure includes: a semiconductor device; a lead frame; a built-in package including an insulated driver having a multi-chip configuration and driving the semiconductor device; a wire connecting the built-in package to the semiconductor device; and a resin sealing the semiconductor device, the lead frame, the built-in package, and the wire, wherein the built-in package is directly joined to the lead frame.

In the present disclosure, the built-in package including the insulated driver having the multi-chip configuration is directly joined to an upper portion of the lead frame. Accordingly, a mechanism such as a spacer for supporting the built-in package is not necessary. Consequently, lowering of insulation performance and reliability may be prevented. Further, the built-in package is directly joined to the upper portion of the lead frame. Thus, development of a new lead frame is not necessary, and cost saving and mountability may be improved.

Other and further objects, features and advantages of the invention will appear more fully from the following description.

DESCRIPTION OF EMBODIMENTS

A semiconductor package according to the embodiments of the present disclosure will be described with reference to the drawings. The same components will be denoted by the same symbols, and the repeated description thereof may be omitted.

First Embodiment

Figure 1:
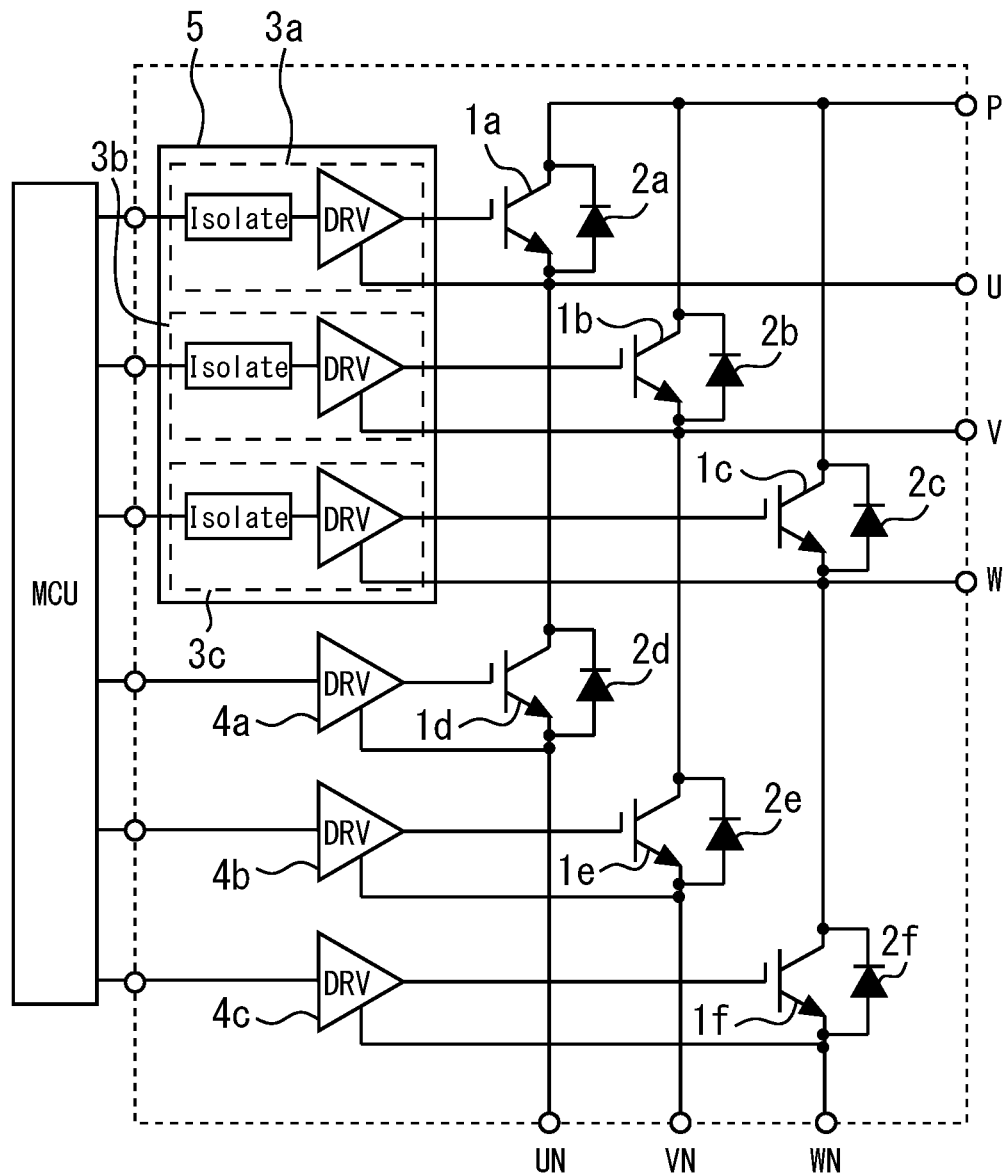
FIG. 1 is a circuit diagram of a semiconductor package according to a first embodiment.

FIG. 1 is a circuit diagram of a semiconductor package according to a first embodiment. This semiconductor package is a transfer-molded power module. P-side semiconductor devices 1a, 1b, and 1c and N-side semiconductor devices 1d, 1e, and 1f are IGBTs and are switching devices of three-phase inverters. Diodes 2a to 2f are freewheeling diodes and are respectively connected in anti-parallel with the semiconductor devices 1a to 1f.

Three high-voltage-side insulated drivers 3a, 3b, and 3c respectively drive the P-side semiconductor devices 1a, 1b, and 1c of three phases in accordance with an input signal from a micro-controller unit (MCU). Three low-voltage-side drivers 4a, 4b, and 4c respectively drive the N-side semiconductor devices 1d, 1e, and 1f of three phases in accordance with an input signal. The three high-voltage-side insulated drivers 3a, 3b, and 3c are integrated in one built-in package 5.

Figure 2:
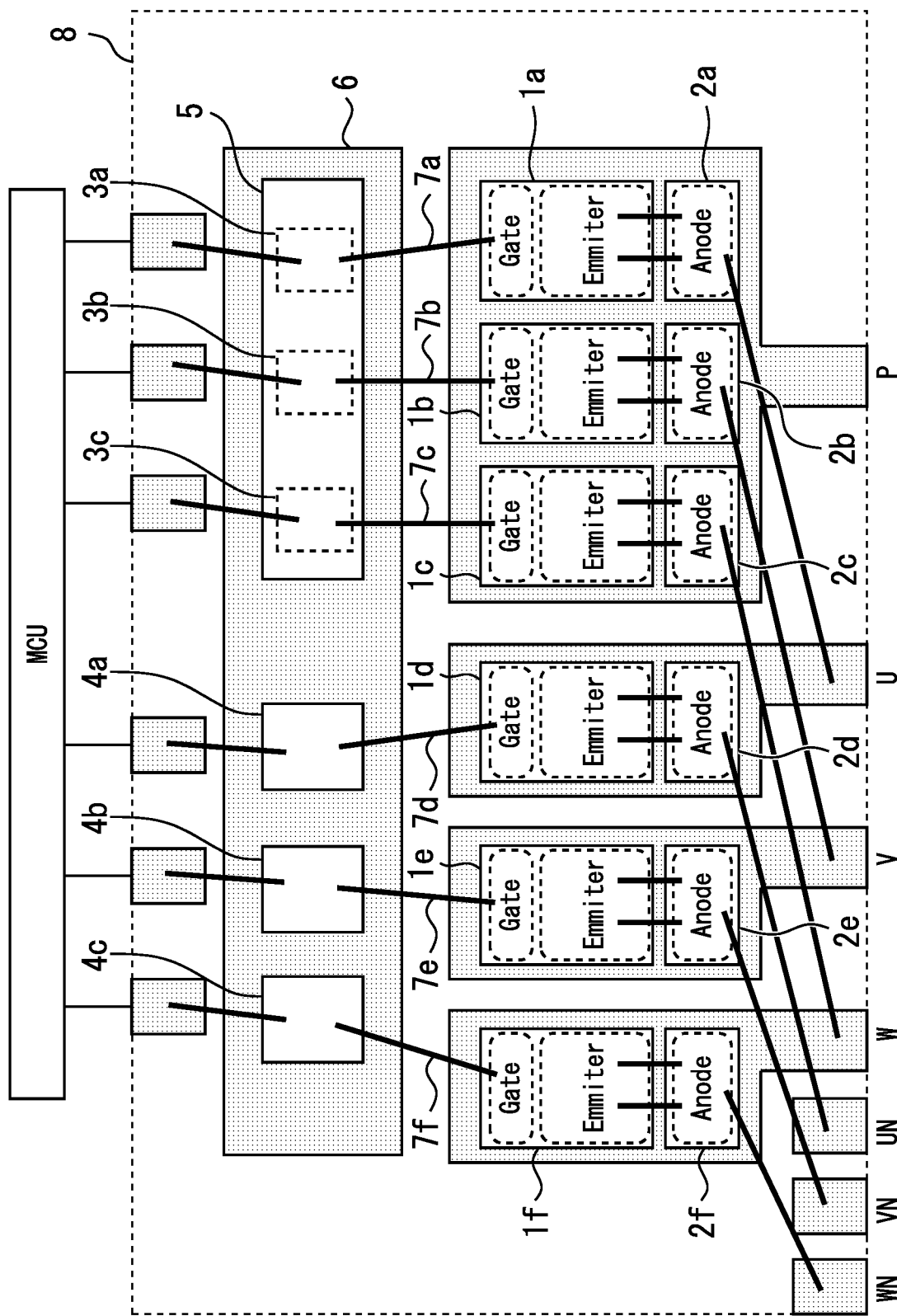
FIG. 2 is a plan view illustrating an internal portion of the semiconductor package according to the first embodiment.

FIG. 2 is a plan view illustrating an internal portion of the semiconductor package according to the first embodiment. Collectors of the P-side semiconductor devices 1a, 1b, and 1c and cathodes of the diodes 2a, 2b, and 2c are connected with a P terminal by solder or the like. A collector of the N-side semiconductor device 1d and a cathode of the diode 2d are connected with a U terminal by solder or the like. A collector of the N-side semiconductor device 1e and a cathode of the diode 2e are connected with a V terminal by solder or the like. A collector of the N-side semiconductor device 1f and a cathode of the diode 2f are connected with a W terminal by solder or the like. Emitters of the semiconductor devices 1a to 1f are respectively connected by wires with anodes of the diodes 2a to 2f. The anodes of the diodes 2a to 2f are connected by wires with the U terminal, the V terminal, the W terminal, a UN terminal, a VN terminal, and a WN terminal, respectively.

The built-in package 5 is mounted on a lead frame 6. The high-voltage-side insulated drivers 3a, 3b, and 3c of the built-in package 5 are respectively connected with gates of the P-side semiconductor devices 1a, 1b, and 1c by wires 7a, 7b, and 7c. The low-voltage-side drivers 4a, 4b, and 4c are respectively connected with gates of the N-side semiconductor devices 1d, 1e, and 1f by wires 7d, 7e, and 7f.

The built-in package 5 and the low-voltage-side drivers 4a, 4b, and 4c are respectively connected by wires with input terminals through which the input signal is input from the external MCU. A resin 8 seals the semiconductor devices 1a to 1f, the diodes 2a to 2f, the built-in package 5, the lead frame 6, the wires 7a to 7f, each terminal, and so forth.

Figure 3:
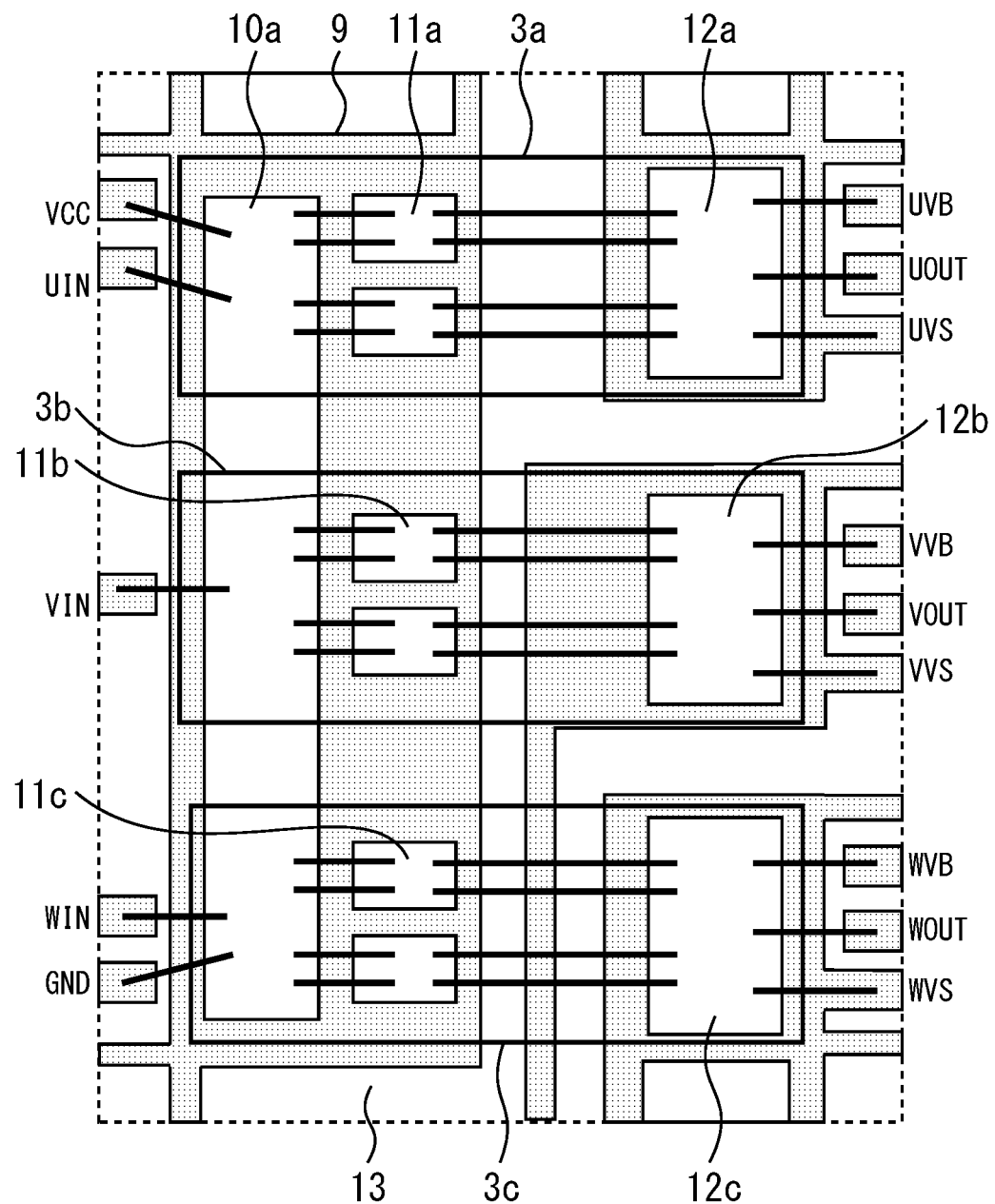
FIG. 3 is a diagram illustrating an internal configuration of the built-in package.

FIG. 3 is a diagram illustrating an internal configuration of the built-in package. A modulation IC 10 and insulation devices 11a, 11b, and 11c are mounted on a lead frame 9. The modulation IC 10 modulates the input signal. The insulation devices 11a, 11b, and 11c are insulation transformers or the like. Because input sides and output sides of the insulation devices 11a, 11b, and 11c are electrically insulated from each other, the insulation devices 11a, 11b, and 11c may transmit a signal from the modulation IC 10 while maintaining insulation. A driving circuit 12a is a U-phase driver IC demodulating an output signal of the insulation device 11a and generating a driving signal driving the semiconductor device 1a. A driving circuit 12b is a V-phase driver IC demodulating an output signal of the insulation device 11b and generating a driving signal driving the semiconductor device 1b. A driving circuit 12c is a W-phase driver IC demodulating an output signal of the insulation device 11c and generating a driving signal driving the semiconductor device 1c.

The insulated driver 3a has the modulation IC 10, the insulation device 11a, and the driving circuit 12a, but those configurations cannot be configured with one chip. Consequently, the insulated driver 3a has a multi-chip configuration in which plural chips are sealed in one package. The insulated drivers 3b and 3c similarly have multi-chip configurations. Those insulated drivers 3a, 3b, and 3c are sealed by a resin 13, and the built-in package 5 is thereby configured. Frames are separated in the built-in package 5, and insulation of each of the driving circuits 12a, 12b, and 12c of U phase, V phase, and W phase is secured with respect to input sides.

Figure 4:
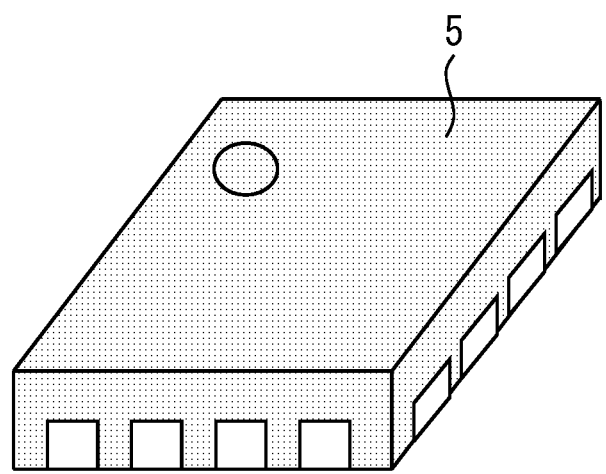
FIG. 4 is a perspective view illustrating an external shape of the built-in package.
Figure 4:
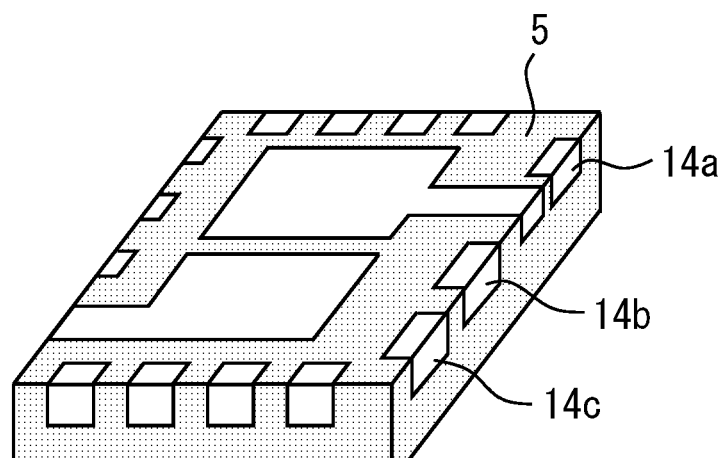

FIG. 4 is a perspective view illustrating an external shape of the built-in package. The built-in package 5 is a quad flat non-lead (QFN) package and has a first main surface and a second main surface that are opposed to each other. Plural electrode pads 14a, 14b, and 14c are provided along four sides of the second main surface of the rectangular built-in package 5. The electrode pads 14a, 14b, and 14c are respectively connected with the insulated drivers 3a, 3b, and 3c in an internal portion of the built-in package 5. Because lead terminals of a QFN package are not drawn out, size reduction is possible.

Figure 5:
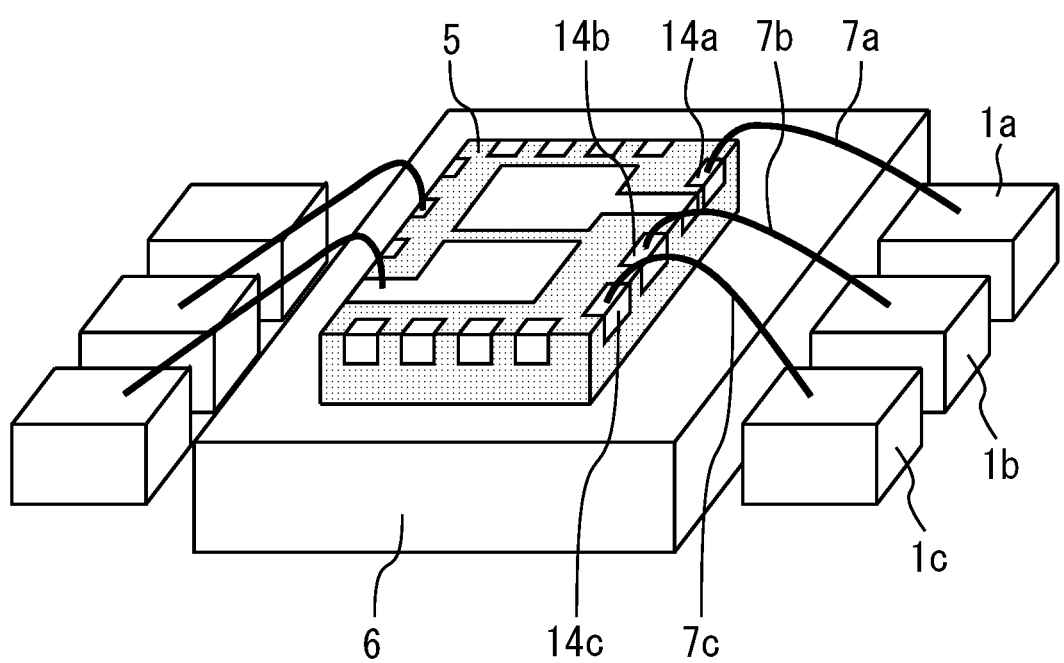
FIG. 5 is a perspective view illustrating a state where the built-in package is mounted.

FIG. 5 is a perspective view illustrating a state where the built-in package is mounted. The first main surface of the built-in package 5 is directly joined to the lead frame 6 via a joining material such as silver paste or resin paste. That is, only the joining material is present between the built-in package 5 and the lead frame 6, but a mechanism such as a spacer is not present. Because the second main surface in which the electrode pads 14a, 14b, and 14c are provided is positioned on the upside, the electrode pads 14a, 14b, and 14c may easily be connected with the P-side semiconductor devices 1a, 1b, and 1c by the wires 7a, 7b, and 7c.

As described in the foregoing, in this embodiment, the insulated drivers 3a, 3b, and 3c having the multi-chip configurations are integrated in one built-in package 5, and the built-in package 5 is directly joined to an upper portion of the lead frame 6. Accordingly, a mechanism such as a spacer for supporting the built-in package 5 is not necessary. Consequently, lowering of insulation performance and reliability may be prevented. Thus, a semiconductor module of this embodiment is capable of being used for usage which requests high insulation and reliability, such as a power module.

Further, the built-in package 5 is directly joined to the upper portion of the lead frame 6. Thus, development of a new lead frame is not necessary, and a lead frame for a power module in related art may be adopted. Consequently, cost saving and mountability may be improved.

In related art, Al wires are used for a semiconductor device, and wires formed of another material than Al such as Au or Ag are used for a driver chip. On the other hand, in this embodiment, the Al wires may be used as the wires 7a, 7b, and 7c bonding with the electrode pads 14a, 14b, and 14c of the built-in package 5. Accordingly, because different wire materials do not have to be used for the semiconductor device and the insulated driver, manufacturability is improved. Further, use of Al wires enables a cost to be reduced compared to Au wires or Ag wires.

Further, in this embodiment, the three high-voltage-side insulated drivers 3a, 3b, and 3c are integrated in one built-in package 5. Accordingly, because a gap of a transmission speed between each phase is decreased, a high speed operation becomes possible compared to a conventional P-side gate driver using level shift. Because routing of wiring at a reference potential of the P-side is decreased, a parasitic L component becomes small, and malfunction due to a secondary-side reference potential fluctuation may be prevented.

Here, because the low-voltage-side drivers 4a, 4b, and 4c are used while their reference potential is set to the same reference potential as a reference potential of a system of a client, signal isolators for the low-voltage-side drivers 4a, 4b, and 4c are not necessarily needed in an operation. Consequently, each of the low-voltage-side drivers 4a, 4b, and 4c is not an insulated driver and is configured with an inexpensive Si chip. Accordingly, a cost may be reduced.

Second Embodiment

Figure 6:
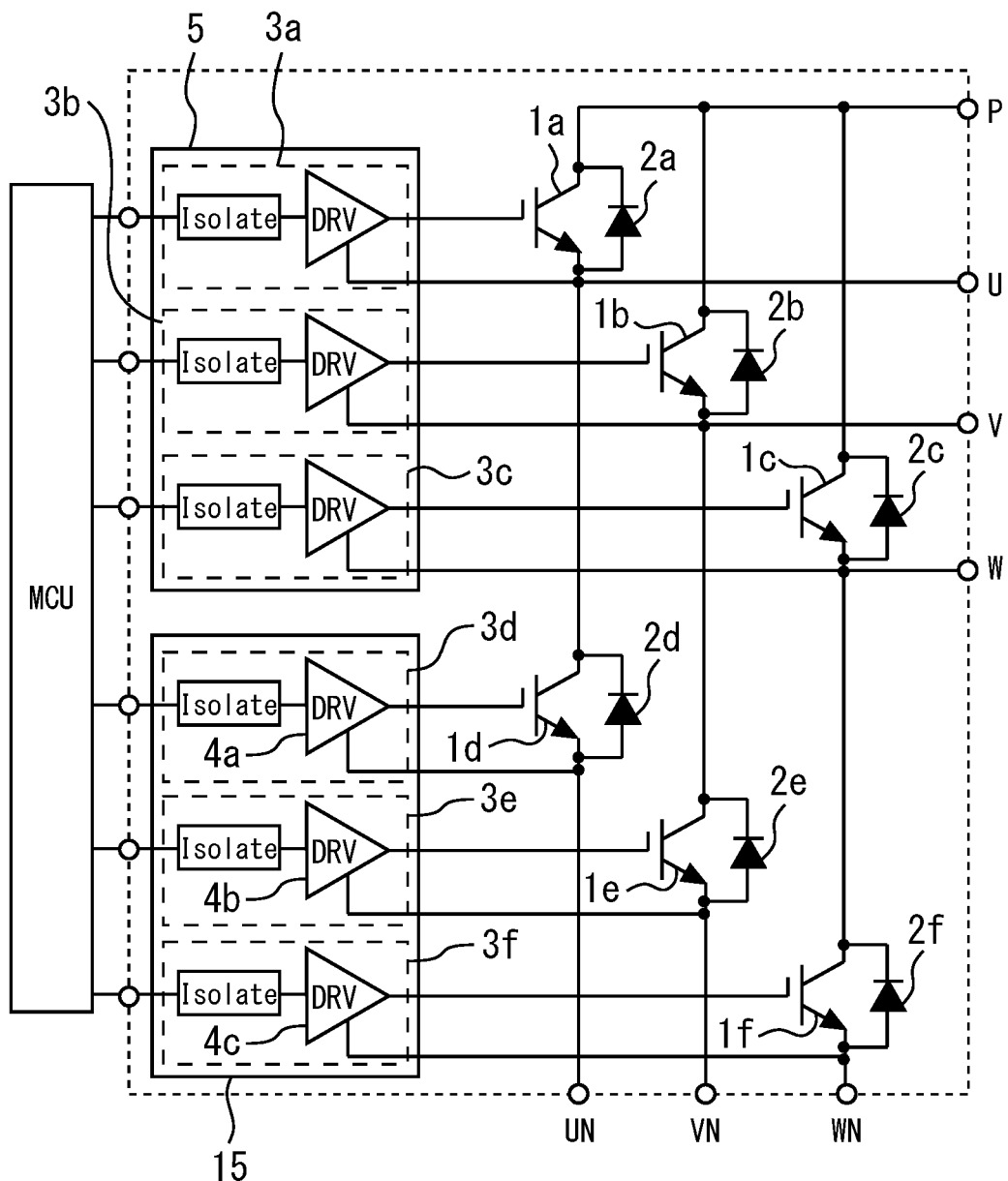
FIG. 6 is a circuit diagram of a semiconductor package according to a second embodiment.
Figure 7:
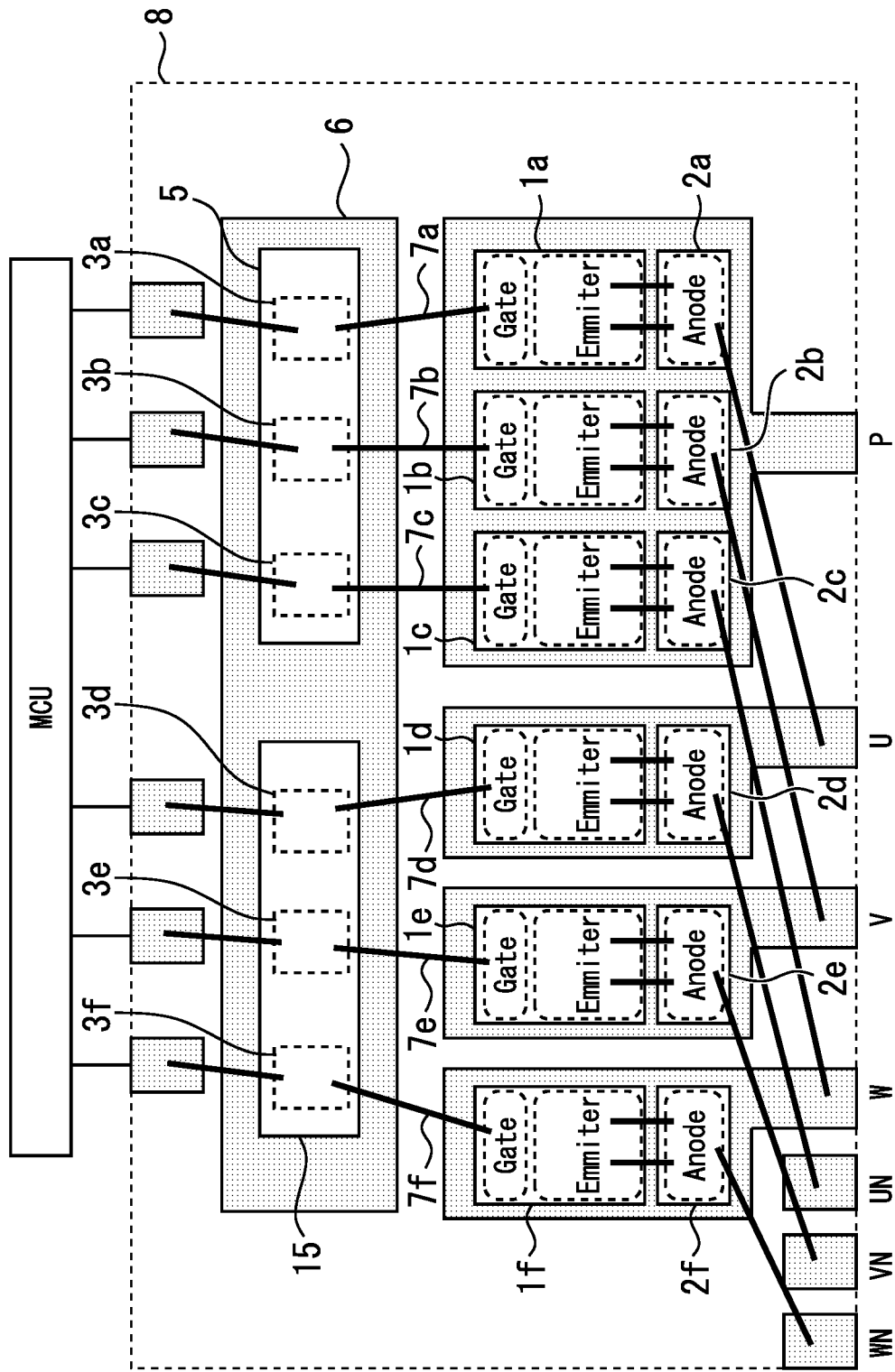
FIG. 7 is a plan view illustrating an internal portion of the semiconductor package according to the second embodiment.

FIG. 6 is a circuit diagram of a semiconductor package according to a second embodiment. FIG. 7 is a plan view illustrating an internal portion of the semiconductor package according to the second embodiment. Similarly to the first embodiment, the three high-voltage-side insulated drivers 3a, 3b, and 3c are integrated in one built-in package 5. Here, depending on the usage, in order to remove an influence due to noise between a semiconductor module and a system of a client, there is a case where a signal isolator may be needed for a low-voltage-side driver. Accordingly, in this embodiment, low-voltage-side insulated drivers 3d, 3e, and 3f are used as low-voltage-side drivers driving the N-side semiconductor devices 1d, 1e, and 1f of three phases. Further, similarly to the high-voltage-side insulated drivers 3a, 3b, and 3c of the first embodiment, the three low-voltage-side insulated drivers 3d, 3e, and 3f are integrated in one built-in package 15. Accordingly, signal isolation between the semiconductor module and the system of the client may be achieved. Further, as a power module, perfect signal isolation is enabled. The other configurations and effects are similar to the first embodiment.

Third Embodiment

Figure 8:
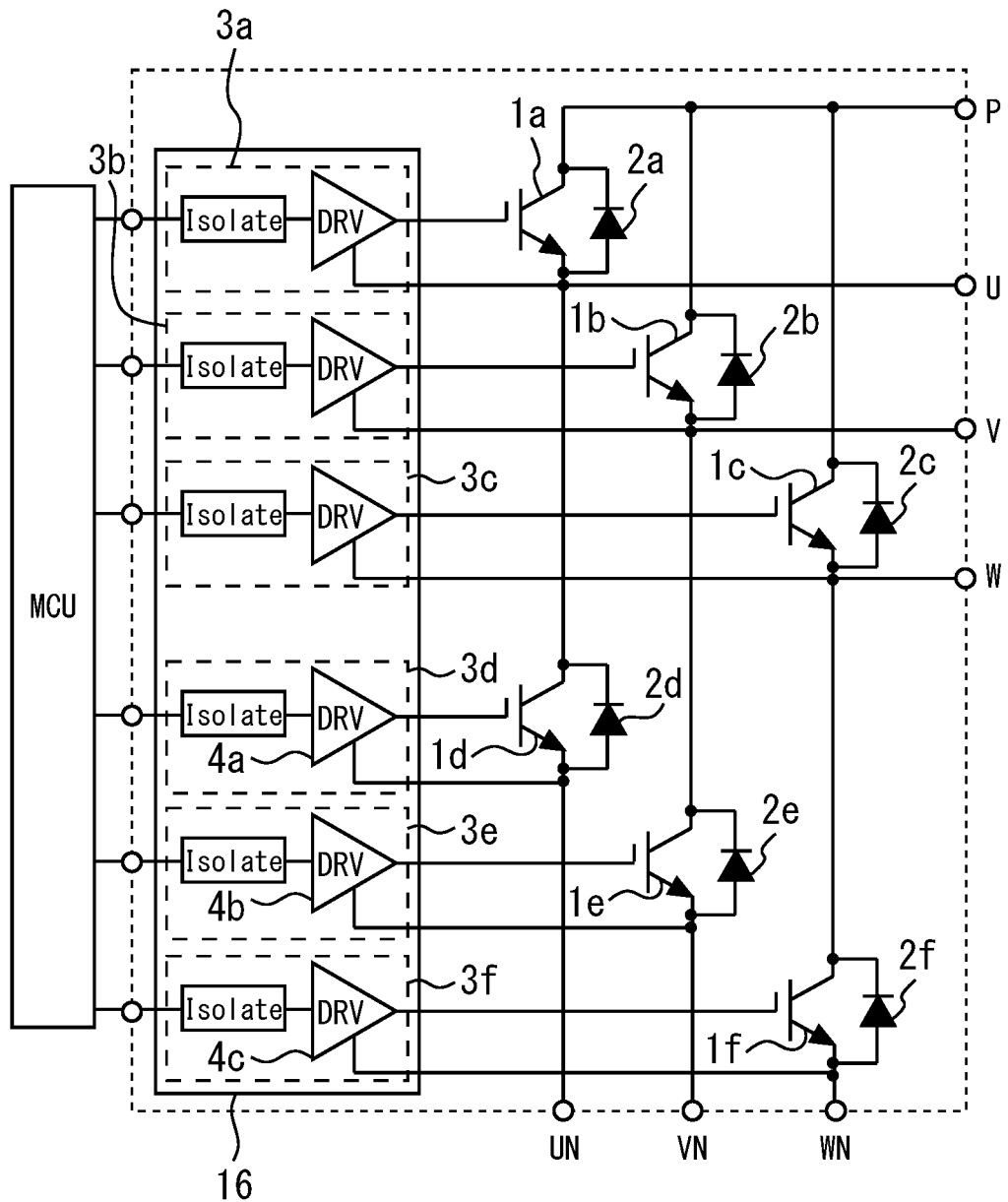
FIG. 8 is a circuit diagram of a semiconductor package according to a third embodiment.
Figure 9:
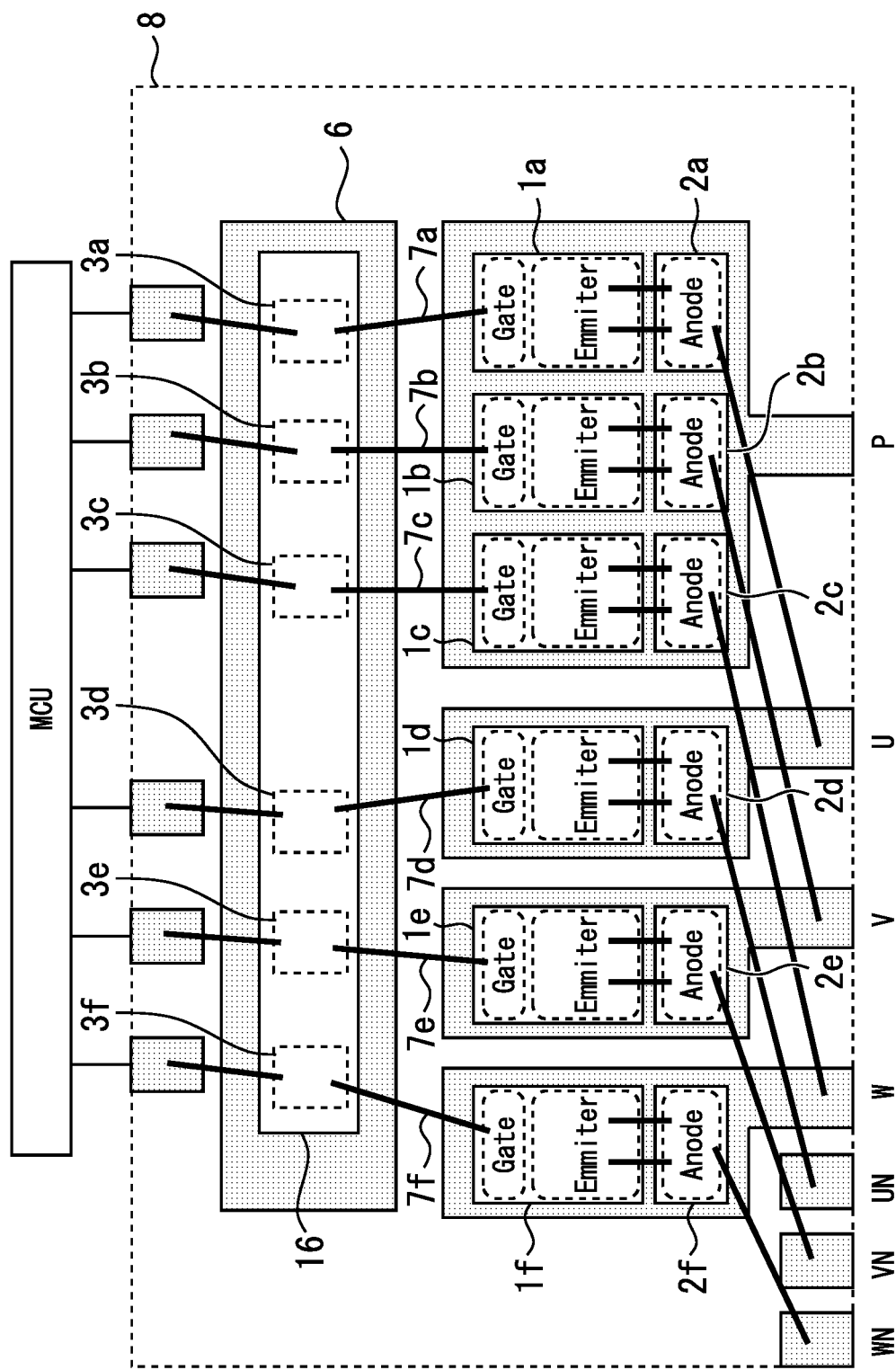
FIG. 9 is a plan view illustrating an internal portion of the semiconductor package according to the third embodiment.

FIG. 8 is a circuit diagram of a semiconductor package according to a third embodiment. FIG. 9 is a plan view illustrating an internal portion of the semiconductor package according to the third embodiment. The three high-voltage-side insulated drivers 3a, 3b, and 3c and the three low-voltage-side insulated drivers 3d, 3e, and 3f, which correspond to a total of six phases on the P side and N side, are integrated in one built-in package 16. Accordingly, the size of an apparatus may be reduced, and wiring may be reduced. The other configurations and effects are similar to the second embodiment.

The semiconductor devices 1a to 1f are not limited to semiconductor devices formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Furthermore, when the semiconductor devices 1a to 1f are SiC devices, advantages of a high withstand voltage and high-frequency driving of a SiC device may be realized by insulation and a high speed of the insulated drivers. Further, when the semiconductor devices 1a to 1f are GaN devices, a high speed of the insulated drivers may be utilized in high carrier driving as a characteristic of a GaN device.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-083335, filed on May 11, 2020 including specification, claims, drawings and summary, on which the convention priority of the present application is based, is incorporated herein by reference in its entirety.

The invention claimed is:

1. A semiconductor package comprising:
a semiconductor device;
a lead frame;
a built-in package including an insulated driver having a multi-chip configuration and driving the semiconductor device;
a wire connecting the built-in package to the semiconductor device; and
a resin sealing the semiconductor device, the lead frame, the built-in package, and the wire, wherein
the built-in package is directly joined to the lead frame.

2. The semiconductor package according to claim 1, wherein the built-in package has a first main surface and a second main surface that are opposed to each other, the first main surface is joined to the lead frame,
an electrode pad connected to the insulated driver is provided on the second main surface, and
the electrode pad is connected with the semiconductor device by the wire.

3. The semiconductor package according to claim 1, wherein the wire is an Al wire.

4. The semiconductor package according to claim 1, wherein the semiconductor device includes P-side semiconductor devices of three phases,
the insulated driver includes three high-voltage-side insulated drivers respectively driving the P-side semiconductor devices of three phases, and
the three high-voltage-side insulated drivers are integrated in the single built-in package.

5. The semiconductor package according to claim 1, wherein the semiconductor device includes P-side semiconductor devices of three phases and N-side semiconductor devices of three phases,
the insulated driver includes three high-voltage-side insulated drivers respectively driving the P-side semiconductor devices of three phases,
the semiconductor package includes three low-voltage-side insulated drivers respectively driving the N-side semiconductor devices of three phases,
the built-in package is a single first built-in package,
the semiconductor package includes a single second built-in package,
the three high-voltage-side insulated drivers are integrated in the single first built-in package, and
the three low-voltage-side insulated drivers are integrated in the single second built-in package.

6. The semiconductor package according to claim 1, wherein the semiconductor device includes P-side semiconductor devices of three phases and N-side semiconductor devices of three phases,
the insulated driver includes three high-voltage-side insulated drivers respectively driving the P-side semiconductor devices of three phases and three low-voltage-side insulated drivers respectively driving the N-side semiconductor devices of three phases, and
the three high-voltage-side insulated drivers and the three low-voltage-side insulated drivers are integrated in the single built-in package.

7. The semiconductor package according to claim 1, wherein the semiconductor device is made of a wide-bandgap semiconductor.

8. The semiconductor package according to claim 7, wherein the semiconductor device is a SiC device.

9. The semiconductor package according to claim 7, wherein the semiconductor device is a GaN device.

10. The semiconductor package according to claim 4, wherein
the semiconductor device includes N-side semiconductor devices of three phases,
three low-voltage-side insulated drivers respectively drive the N-side semiconductor devices of three phases, and
the three low-voltage-side insulated drivers are separated from each other and separate from the built-in package.

11. The semiconductor package according to claim 1, the built-in package and the semiconductor package forming a package in package (PIP) configuration.

12. The semiconductor package according to claim 1, the built-in package being a quad flat non-lead package.

13. The semiconductor package according to claim 1, the insulated driver having an input side and an output side that are insulated from each other.

\* \* \* \* \*